United States Patent
Fissore et al.

(10) Patent No.: US 6,933,593 B2
(45) Date of Patent: Aug. 23, 2005

(54) POWER MODULE HAVING A HEAT SINK

(75) Inventors: Sergio Fissore, Redondo Beach, CA (US); William Grant, Fountain Valley, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/917,976

(22) Filed: Aug. 13, 2004

(65) Prior Publication Data

US 2005/0035434 A1 Feb. 17, 2005

Related U.S. Application Data

(60) Provisional application No. 60/496,001, filed on Aug. 14, 2003.

(51) Int. Cl.[7] .................. H01L 23/495; H01L 23/34; H01L 23/48; H01L 23/52

(52) U.S. Cl. ............... 257/675; 257/666; 257/691; 257/692; 257/698; 257/723; 257/724; 257/690

(58) Field of Search ................. 257/675, 666, 257/691, 692, 698, 690, 723

(56) References Cited

U.S. PATENT DOCUMENTS

| | | | |
|---|---|---|---|
| 6,359,331 B1 * | 3/2002 | Rinehart et al. | 257/691 |
| 6,384,492 B1 * | 5/2002 | Iversen et al. | 307/147 |
| 6,841,852 B2 * | 1/2005 | Luo et al. | 257/666 |

* cited by examiner

*Primary Examiner*—Nitin Parekh
(74) *Attorney, Agent, or Firm*—Ostrolenk, Faber, Gerb & Soffen, LLP (57) ABSTRACT

A power module that includes a molded shell having a lead frame molded in a mold body, and a plurality of power semiconductor devices disposed directly on the die pads of the lead frame.

18 Claims, 8 Drawing Sheets

POWER MODULE HAVING A HEAT SINK

RELATED APPLICATION

This application is based on and claims benefit of U.S. Provisional Application No. 60/496,001, filed on Aug. 14, 2003, entitled MODULE FOR EPAS/EHPAS APPLICATIONS, to which a claim of priority is hereby made and the disclosure of which is incorporated by reference.

BACKGROUND OF THE INVENTION

The power semiconductor devices of power systems are typically integrated to form a power module. Most power modules thus include power semiconductor devices, such as power diodes and power MOSFETs. A power semiconductor device generates heat during operation. The heat so generated affects the operation of the semiconductor device, and also may have an adverse effect on the structural integrity of the power module by for example creating thermal stresses which may lead to fractures and other mechanical damage. The heat generated by the power semiconductor devices must, therefore, be extracted and dissipated. Otherwise the continued operation of the power semiconductor devices may be jeopardized.

In a conventional power module, the generated heat is typically passed to a heatsink for dissipation. Serving as a thermal conduit is usually a thermally conductive substrate which is interposed between the heat generating power semiconductor devices and the heatsink.

A known thermally conductive substrate is referred to as insulated metal substrate (IMS). Another known thermally conductive substrate is direct bonded copper (DBC). The use of an IMS or a DBC is undesirable due to cost, increase in the thermal resistance of the entire stack in the application, thermal capacitance at the die, and typically higher electrical loop resistance of the power module. Due to the less than ideal heat extractive capabilities of a design that includes and IMS or a DBC, the reaching of the maximum rating of a power semiconductor device is avoided to prevent overheating. Thus, the use of an IMS or a DBC may hinder the designers to take full advantage of the capability of a power semiconductor device, which may lead to inefficient power designs, among other disadvantageous results.

Power modules are prevalently used in the automotive industry, particularly for the driving and the control of electric motors, among other uses. The increase in the number of features in an average automobile has caused and continues to cause an increased demand for generic or function-specific power modules. Yet, the market place demands reduction of cost per module as well as module efficiency so that the final cost of the car remains competitive and electric power used by the extra features requires as little extra power demand as possible on the automobile's electric system.

Thus, it is desirable to have a power module which can adequately dissipate the generated heat without using a thermally conductive substrate.

SUMMARY OF THE INVENTION

A power module according to the present invention is adapted to include the power elements for an Electric Power Assisted Steering (EPAS)/Electro-Hydraulic Power Assisted Steering (EHPAS).

A power module according to the present invention includes a molded shell having a plurality of walls defining a space, and a base portion. The molded shell further includes a lead frame having a plurality of leads extending from the defined space through the walls of the molded shell, and a plurality of conductive pads each integrally connected with at least one lead. Each conductive pad has at least one power semiconductor device electrically and mechanically attached thereto by, for example, a layer of solder, whereby the heat generated by the device is transferred to the conductive pad. The heat so transferred is partially dissipated by the leads integral with the conductive pad. The remainder of the heat is transferred to a heatsink through a body of thermally conductive adhesive, which attaches the heatsink to the conductive pads. Thus, a module according to the present invention does not require a thermally conductive substrate. As a result, a module according to the present invention exhibits improved thermal resistance.

The improvement in the thermal resistance (the lowering of the thermal resistance) is advantageous in that it allows the designer to select smaller die than the die used in an application using an IMS or DBC. Such an option can, among other advantages, lead to cost reduction.

Furthermore, once an IMS or DBC is eliminated from the design, the number of interconnections and groupings of the wirebonds are reduced, which reduces the overall resistance of the module.

According to one aspect of the present invention the lead frame in a module according to the present invention includes a plurality of die pads each for receiving at least one power semiconductor device arranged along one line, and a plurality of die bond pads arranged along another parallel and opposing line. The arrangement of the die pads and the wire bonds along parallel and opposing lines simplifies manufacturing.

In addition, mounting a semiconductor die such as a power MOSFET on a conductive pad of a lead frame may also result in the lowering of the overall resistance of the module in that the conductive pads used may be thicker than those used when an IMS or a DBC is used. Specifically, when an IMS or a DBC is used, the coefficient of thermal expansion of the metal layer and the coefficient of thermal expansion of the substrate require the thickness of the metal layer to be kept below a certain minimum in order to prevent thermal strains (usually resulting from thermal cycling) to cause the conductive pad to peel off. Thus, for example, in a typical IMS the conductive pads may be only 10–12 mils thick. Whereas, the conductive pads in a module according to the present invention may be made thicker, which results in reduced resistance and improved heat dissipation.

Furthermore, the arrangement of the die pads and the wire bonds along parallel and opposing lines allows for generally parallel wire bonds for connecting the power semiconductor devices to respective die pads, which also simplifies manufacturing.

In a power module, a large percentage of the overall resistance is contributed by the wire bonds. In the preferred embodiment five wire bonds are used per die to reduce resistance. According to an aspect of the present invention, the five wire bonds are staggered, and three out of the five wire bonds are along a larger curvature. As a result, when the load is a motor, a module according to the present invention causes lower vibrations and higher torques, i.e. better performance.

According to another aspect of the present invention, a power module according to the present invention includes a shunt resistor which is electrically connected to external leads without the use of wire bonds to reduce the parasitic inductance and resistance which may affect the proper reading of the current passing therethrough. Furthermore, a module according to the preferred embodiment also includes a thermistor and has room for a high frequency bus capacitor as well.

A module according to the preferred embodiment of the present invention includes other unique and advantageous features which are described in detail in the following description and shown in the accompanying drawings.

DETAILED DESCRIPTION OF THE FIGURES

Figure 1:
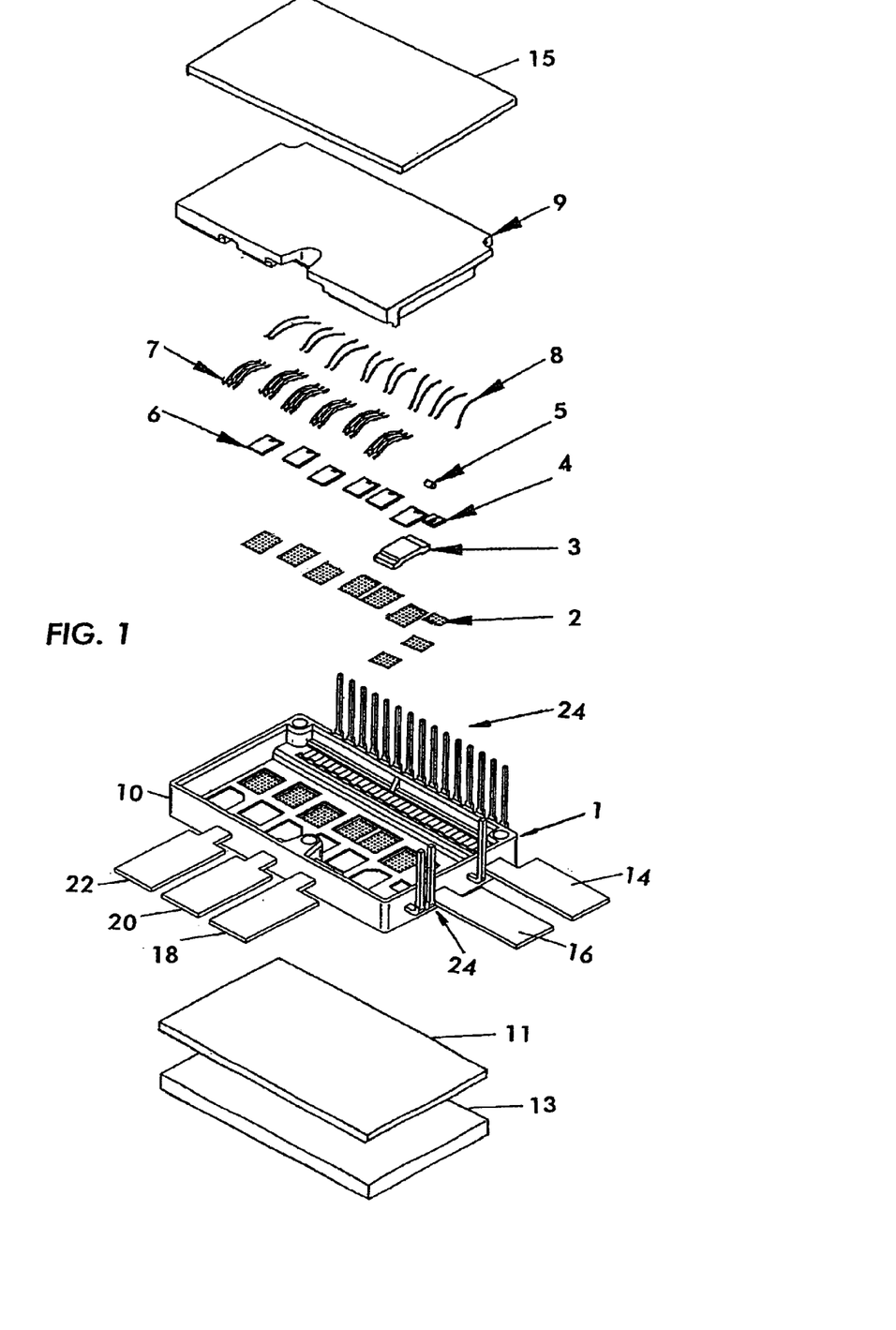
FIG. 1 is an exploded view of a module according to the present invention.

Referring to FIG. 1, a module according to the present invention includes molded shell 1, a plurality of power semiconductor devices 6, a shunt resistor 3, thermistor 4, a plurality of large diameter bondwires 7 (e.g. 20 mils thick), a plurality of small diameter bondwires 8 (e.g. 8 mils thick), encapsulant 9, solder layers 2, thermally conductive adhesive body 11, heatsink 13, and lid 15.

According to one aspect of the present invention, molded shell 1 includes a lead frame and a molded body 10. The lead frame includes a plurality of leads and a plurality of conductive pads all molded in molded body 10.

Figure 2:
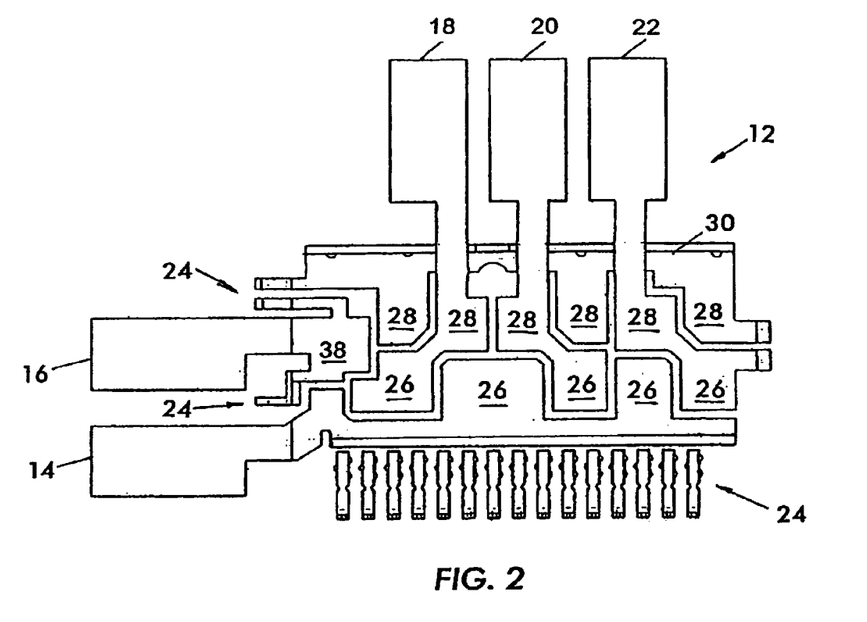
FIG. 2 is a top plan view of a lead frame as used in a module according to the present invention.
Figure 3:
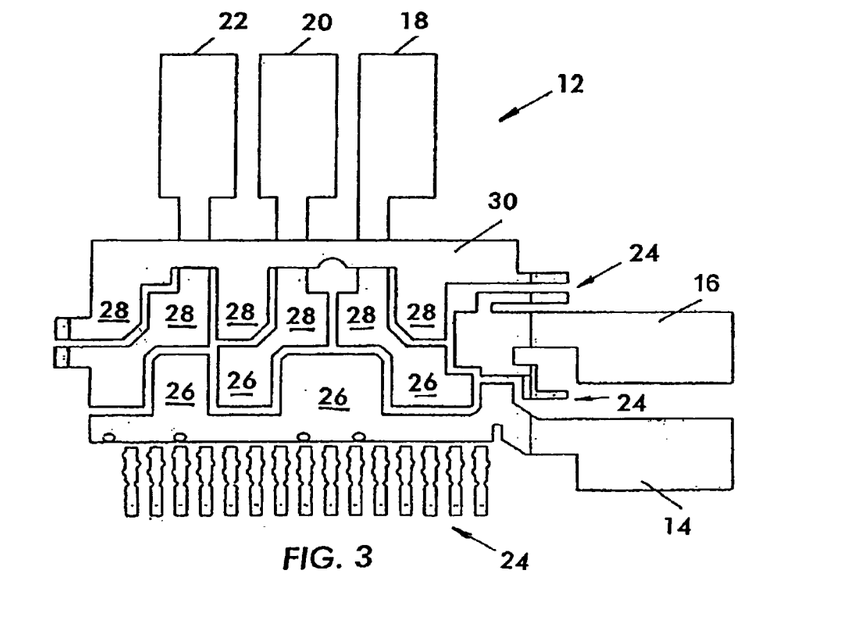
FIG. 3 is a bottom plan view of the lead frame shown in FIG. 2.
Figure 4:
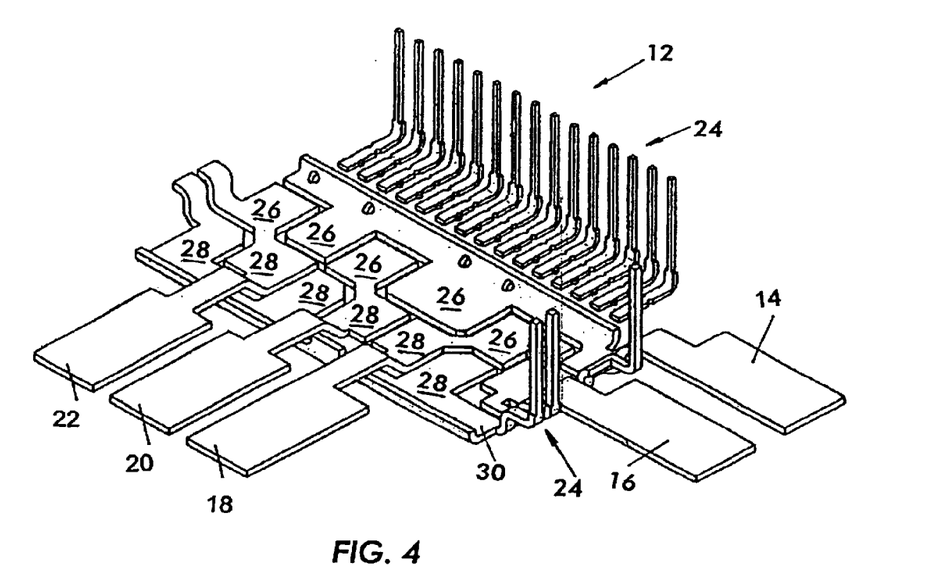
FIG. 4 is a top isometric view of the lead frame shown by FIG. 2.
Figure 5:
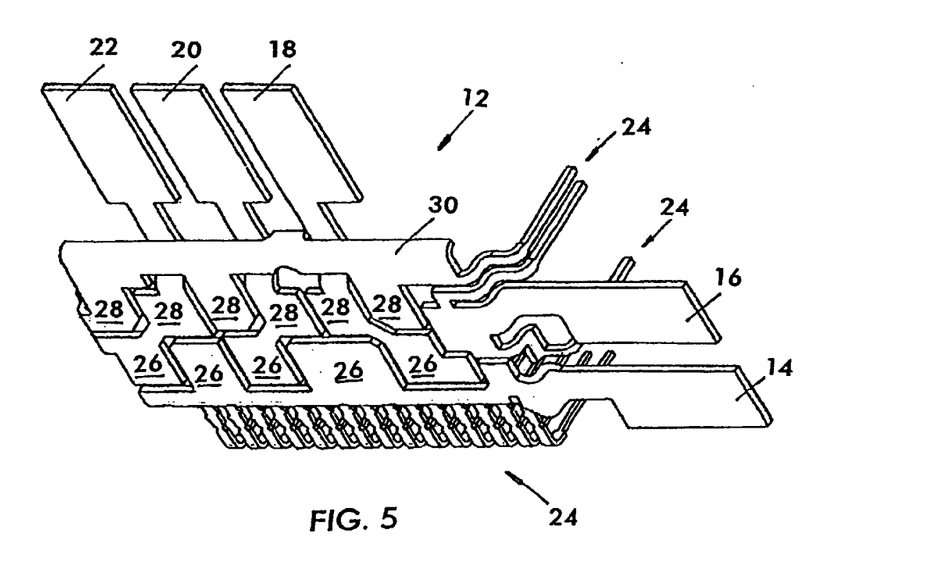
FIG. 5 is an isometric bottom view of the lead frame shown in FIG. 2.

Referring now to FIGS. 2, 3, 4, and 5, lead frame 12 as used in the preferred embodiment of the present invention includes power input lead 14, ground lead 16, first output lead 18, second output lead 20, third output lead 22, and a plurality of pin leads 24. Lead frame 12 further includes a plurality of conductive pads. Specifically, lead frame 12 includes a plurality of die pads 26, and a plurality of wire bond pads 28. As seen in FIG. 2, each output lead 18, 20, 22 is integral with at least one wire bond pad 28, and one die pad 26. Furthermore, power input lead 14 is integral with the remaining die pads 26, while the remaining wire bond pads 28 are integral with the tie bar 30, which itself is integral with one pin lead 24. Tie bar 30 is preferably in the same plane as wire bond pads 28 and extends below output leads 18, 20, 22. That is, output leads 18, 20, 22 are bent so that they may extend over tie bar 30.

According to one aspect of the present invention, wire bond pads 28 are arranged along a first line, and die bond pads 26 are arranged along a second line opposite and parallel to the first line. Thus, as will be explained later, all power semiconductor devices disposed on die pads 26 will be arranged along a common line, which advantageously simplifies manufacturing.

Figure 6:
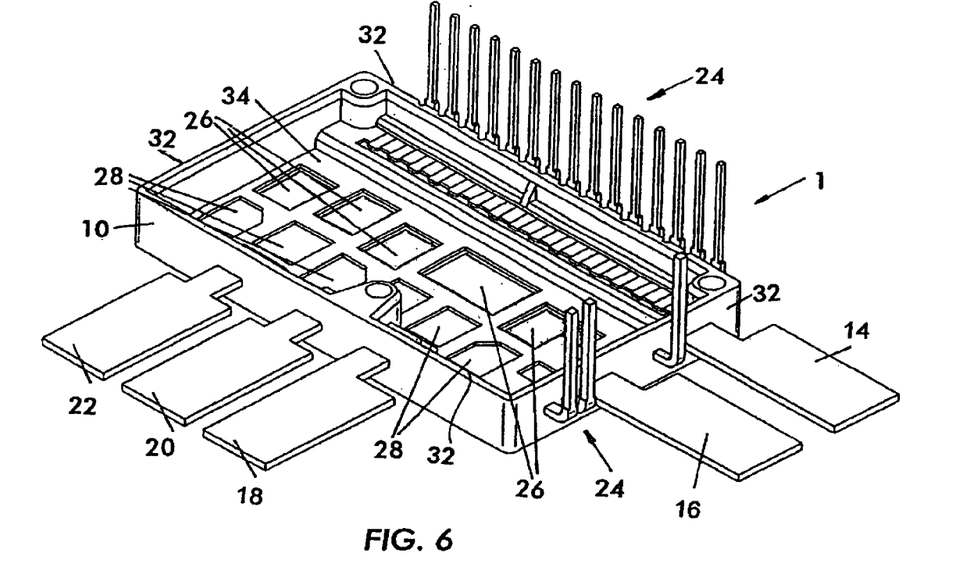
FIG. 6 shows an isometric top view of a molded shell of a module according to the present invention.
Figure 7:
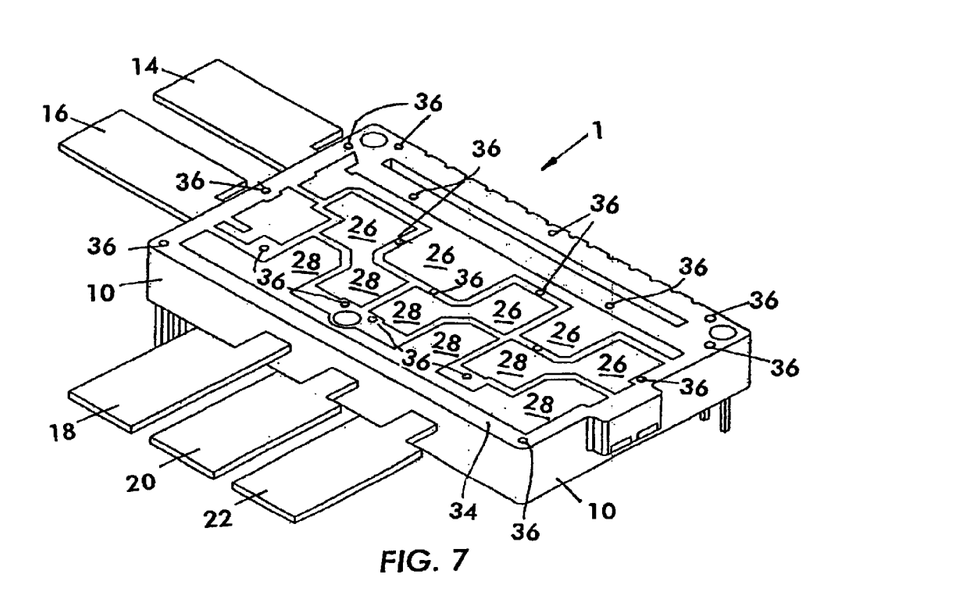
FIG. 7 shows an isometric bottom view of the molded shell shown in FIG. 6.

Referring now to FIGS. 6 and 7, lead frame 12 is molded over with molded body 10 to form molded shell 1. Molded shell 1 includes a plurality of walls 32 extending from and defining a space over base portion 34. According to another aspect of the present invention, base portion 34 includes and is formed with at least spaced conductive pads 26, 28 and mold compound which is disposed in spaces between conductive pads 26, 28. The mold compound disposed in spaces between conductive pads 26, 28 electrically insulates conductive pads 26, 28, and mechanically binds the same, whereby the mold compound and conductive pads 26, 28 form base portion 34 of molded shell 1.

Referring now to FIG. 7 specifically, base portion 34 includes bumps 36 formed on the exterior surface thereof. Bumps 36 are formed from the mold compound, are preferably 0.1 mm tall, and are scattered over the exterior surface of base portion 34. Bumps 36 are intended as spacers to space base portion 34 from heat sink 13 to define the thickness of thermally conductive adhesive body11 which is used to thermally and mechanically connect heatsink 13 to base portion 34 and electrically insulate heatsink 13 from base portion 34.

Figure 8:
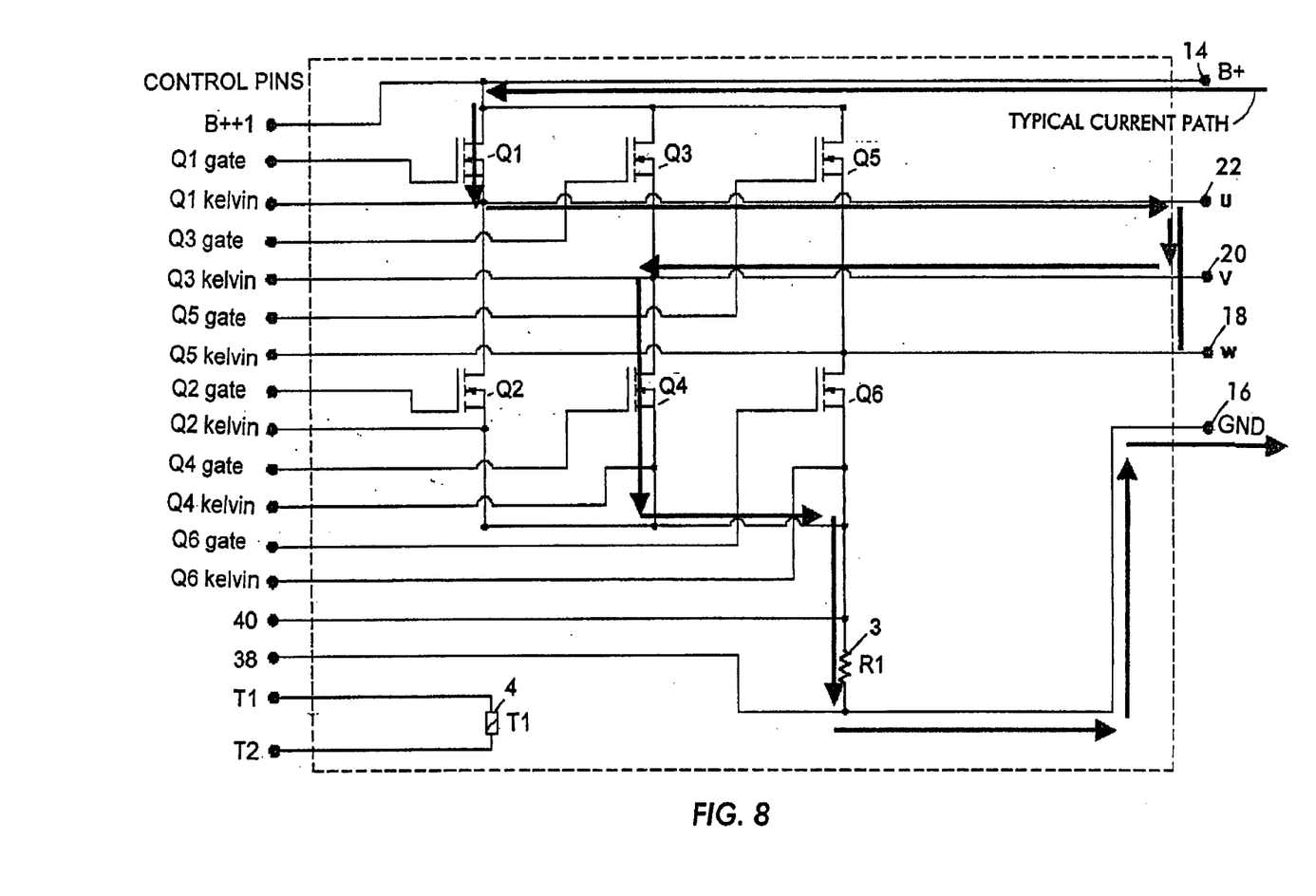
FIG. 8 shows a circuit diagram of the preferred embodiment of a module according to the invention.

Referring now to FIG. 8, a module according to the preferred embodiment of the present invention is adapted to include power elements for three half-bridge circuit for providing power preferably to a three-phase motor. As is well known, a half-bridge circuit includes a high side power semiconductor device series connected to a low side power semiconductor device. In the preferred embodiment, the first half-bridge circuit for providing power to a first phase U of a motor includes high side power MOSFET Q1 which is connected at its source side to the drain side of low side power MOSFET Q2, the second half-bridge circuit for providing power to the second phase V of a motor includes high side MOSFET Q3 which is connected at its source side to the drain side of low side power MOSFET Q4, and the third half-bridge circuit for providing power to the third phase W of a motor includes high side power MOSFET Q5 which is connected at its source side to the low side power MOSFET Q6. The drain electrode of each high side power MOSFET Q1, Q3, Q5 is connected to the power input line B+, while the source side of low side power MOSFETS Q2, Q4, Q6 are connected to ground GND through shunt resistor 3. Each power MOSFET Q1, Q2, Q3, Q4, Q5, Q6 is controlled by a signal which is received at its gate.

Figure 9A:
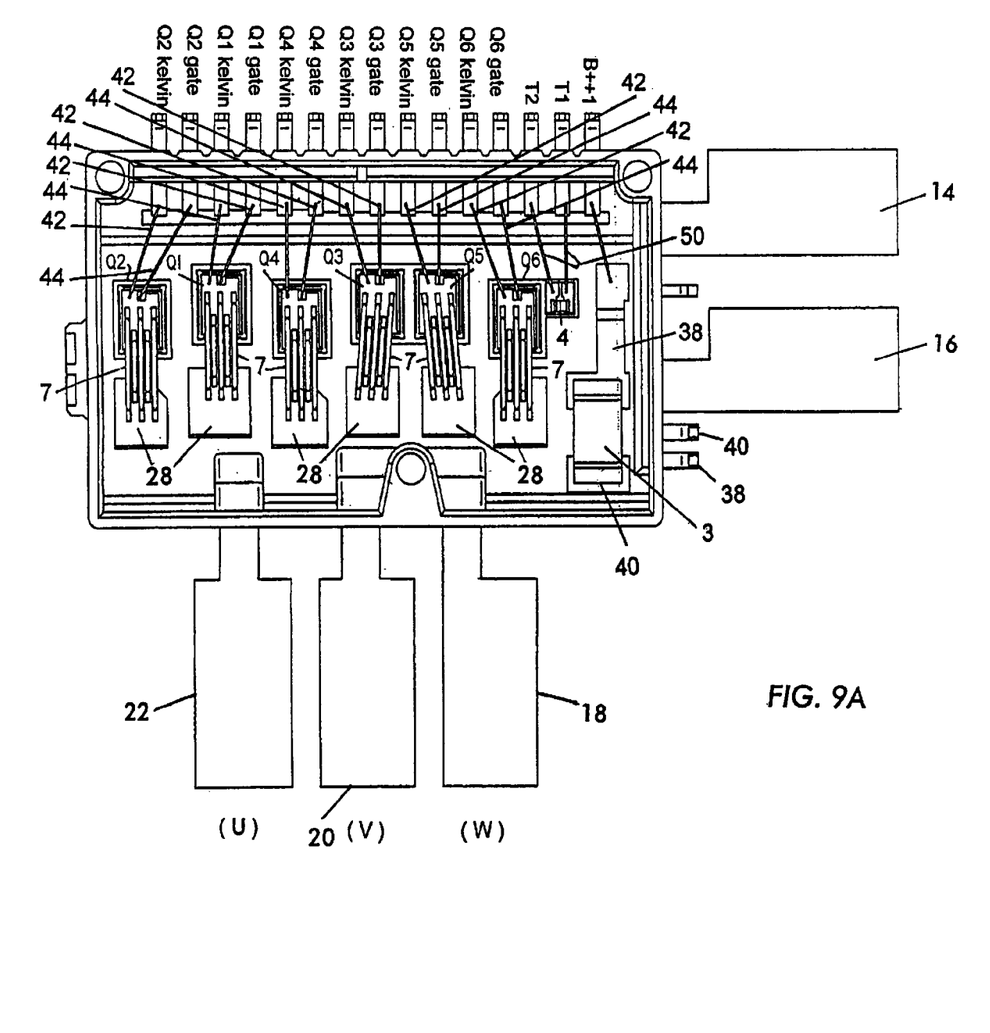
FIG. 9A shows a top plan view of a module according to the present invention with its lid removed to show the internal arrangement of its elements.
Figure 9B:
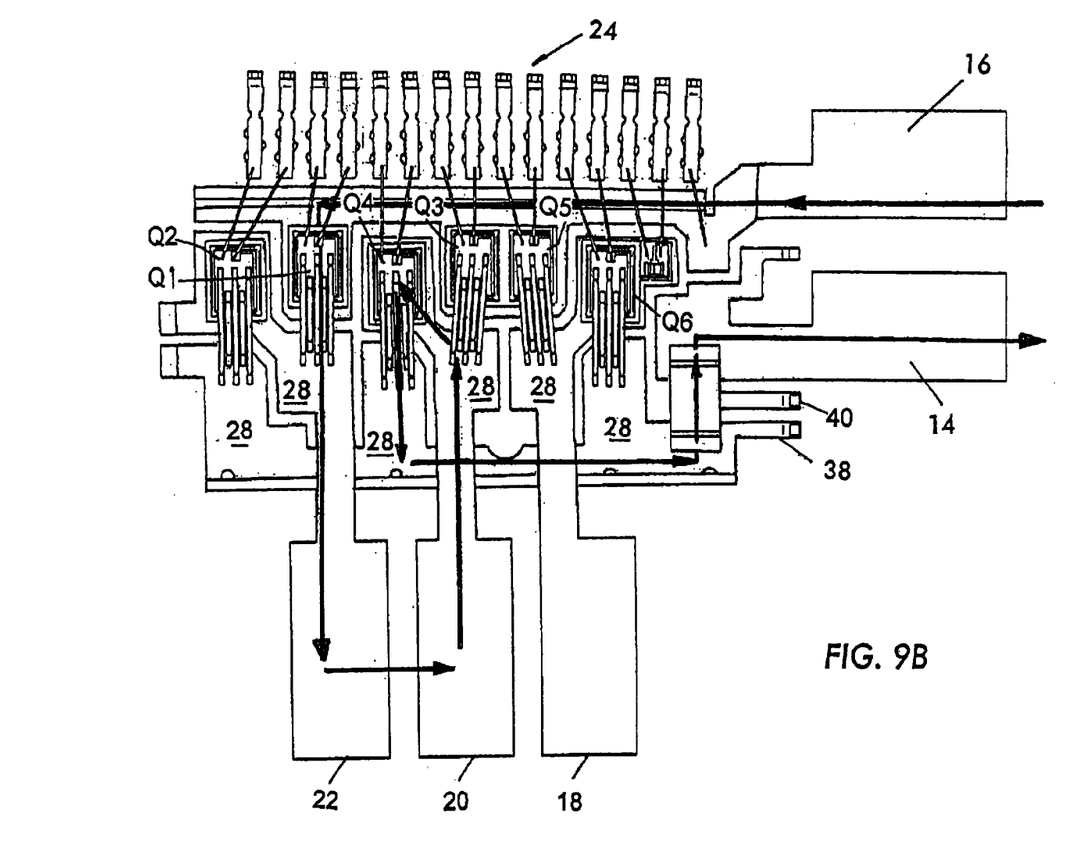
FIG. 9B illustrates the internal connection of elements of a module according to the present invention.

Referring now to FIGS. 9A, 9B, each power MOSFET Q1, Q2, Q3, Q4, Q5, Q6 is electrically and mechanically connected at its drain side to a respective die pad 26 by a layer of solder 2, and at its source side to a respective bondwire pad 28 by a plurality of large diameter bondwires 7 which may be of any conventional type suitable for power transmissions. According to an aspect of the present invention, large diameter bondwires 7 are staggered so the current densities are evenly distributed on the source metallization of each power MOSFET. Thus, in the preferred embodiment, two of the five larger diameter wire bonds 7 are shorter than the other three.

According to another aspect of the present invention, large diameter wire bonds 7 are generally parallel. The parallel orientation of large diameter wire bonds 7, and the arrangement of all power MOSFETS Q1, Q2, Q3, Q4, Q5, Q6 advantageously simplify and speed up the manufacturing of a module according to the present invention.

According to another aspect of the present invention, shunt resistor 3 is electrically connected to ground lead 16 through conductive pad 38 and to a portion 40 of tie bar 30. It should be noted that each of tie bar 30 and conductive pad 38 is integral with a respective pin lead 24, which can then be used to sense the shunt resistor 3.

The remaining pin leads are provided for the following functions.

$Q_{2Kelvin}$, to carry source voltage from the source of power MOSFET Q2 via a Kelvin wire 42.

$Q_{2gate}$, to send voltage to the gate of power MOSFET Q2 via gate wire 44.

$Q_{1Kelvin}$, to carry source voltage from the source of power MOSFET Q1 via a Kelvin wire 42.

$Q_{1gate}$, to send voltage to the gate of power MOSFET Q1 via gate wire 44.

$Q_{4Kelvin}$, to carry source voltage from the source of power MOSFET Q4 via a Kelvin wire 42.

$Q_{4gate}$, to send voltage to the gate of power MOSFET Q4 via gate wire 44.

$Q_{3Kelvin}$, to carry source voltage from the source of power MOSFET Q3 via a Kelvin wire 42.

$Q_{3gate}$, to send voltage to the gate of power MOSFET Q3 via gate wire 44.

$Q_{5Kelvin}$, to carry source voltage from the source of power MOSFET Q5 via a Kelvin wire 42.

$Q_{5gate}$, to send voltage to the gate of power MOSFET Q5 via gate wire 44.

$Q_{6Kelvin}$, to carry source voltage from the source of power MOSFET Q6 via a Kelvin wire 42.

$Q_{6gate}$, to send voltage to the gate of power MOSFET Q6 via gate wire 44.

Pin leads $T_1$, $T_2$ are connected to respective poles of thermistor 4 by wire bonds 50 to provide information regarding the temperature of power MOSFET Q6. It should be noted that thermistor 4 is disposed on circuit board 46. Circuit board 46 and power MOSFET Q6 are disposed on the same die pad in the preferred embodiment.

Figure 10:
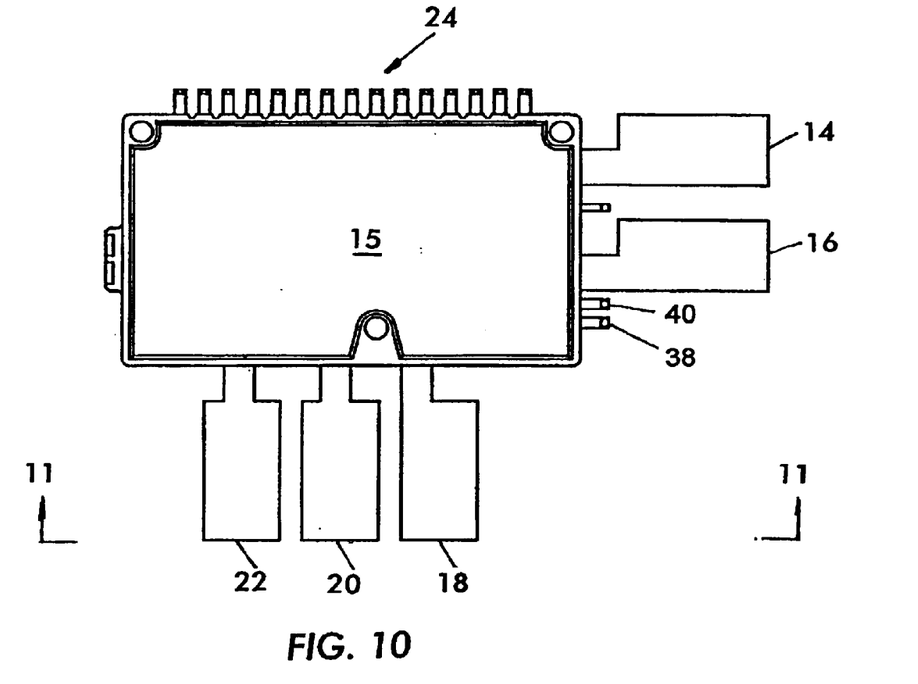
FIG. 10 is a top plan view of a module according to the present invention.

Once all wire bond connections are made, the space defined by walls 32 and base 34 of molded shell 1 is filled with encapsulant 9 which is preferably a silicone gel. Thereafter, lid 15 is attached to walls 32, preferably with an adhesive, to enclose the space defined by walls 32 and base 34, as seen in FIG. 10.

Figure 11:
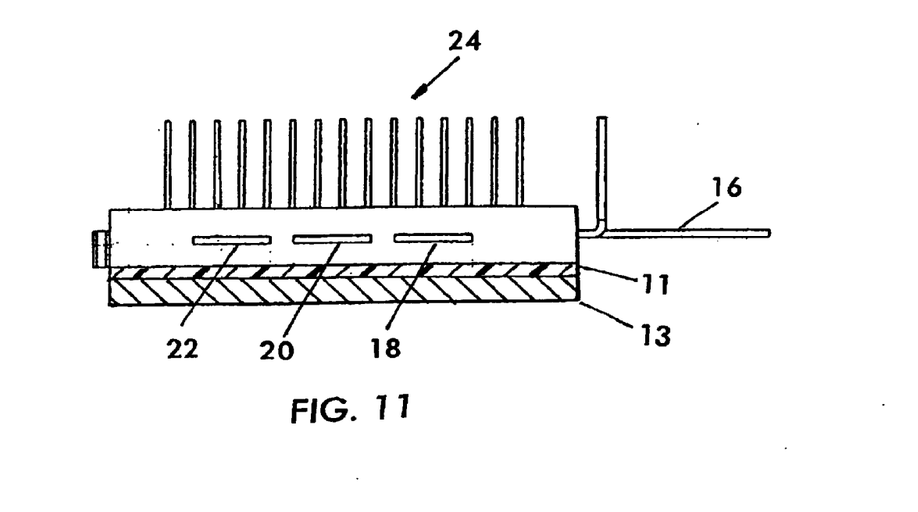
FIG. 11 is a side plan view of a module according to the present invention as seen in the direction of arrows 11—11.

Referring now to FIG. 11, according to an aspect of the present invention, heatsink 13 is thermally and mechanically attached to the exterior surface of base 34 of molded shell 1 by a thermally conductive adhesive body 11. Thermally conductive adhesive 11 may be an elastomer, such as a silicone-based elastomer, which is loaded with thermally conductive particles such as alumina particles. Preferably, the elastomer adheres well to both heatsink 13 and base portion 34, and is also capable of electrically insulating the conductive pads 26, 28 of base portion 34 from heatsink 13.

According to an aspect of the present invention, molded shell 1 is formed by forming molded body 10 around lead frame 12 in a single injection molding step. Thus, base portion 34 and walls 32 are formed into an integral unit.

A module according to the present invention is manufactured by first forming molded shell 1, depositing solder on die pads 26, placing power MOSFETs on solder layers so deposited, and applying heat to raffle the solder. Thus, according to an aspect of the present invention, the mold compound used for forming the molded body 10 of molded shell 1 is capable of withstanding at least the applied solder raffle temperature.

After, the solder is reflown, flux material is removed, and the wire bonds are connected in two steps. In a first step, large diameter wire bonds 7 are connected by ultrasonic wire bonding. In the next step, the remaining wire bonds are connected also by ultrasonic wire bonding. Thereafter, a silicone gel is disposed within the space defined by walls 32 of molded shell 1 and cured to form encapsulant 9. In the last step, lid 15 is attached to enclose the defined space.

A preferred material to be used as a mold compound is polypthalamide (PPA) provided by AMODEL. Another preferred material is Polyphenylenesulfide (PPS).

Furthermore, lead frame 12 may be formed from copper, which may be plated with nickel to promote reliability of bonding with wire bonds. Aluminum inlay on pin leads may also enhance reliability of bonding with bondwires although pin leads may also be nickel plated. In the preferred embodiment, lead frame 12 may be 1 mm thick to reduce thermal and electrical resistance of the module.

In the preferred embodiment, all 20 mil wire bonds (large diameter wire bonds 7) land on nickel plated portions of the lead frame, and all 8 mil wire bonds (small wire bonds 8) land on nickel plated or aluminum inlay lead frame portions.

Pb/Sn, Sn/Ag, and Pb/Sn/Ag compositions may be used for solder in the preferred embodiment, although the use of other conductive adhesives such as conductive epoxies or other solder compositions are considered to be within the scope of the present invention.

The solder most preferred is Sn/Ag which is lead free and can be automatically dispensed by a solder dispenser. Depending on surface finish of the lead frame, the solder could be Sn/Ag/Cu.

Furthermore, a module according to the present invention can include a high frequency (HF) capacitor to improve the module's high frequency EMI characteristics. An HF capacitor can be connected between positive and negative battery terminals (14, 16) inside the module. Referring to FIG. 9A, a location for an HF capacitor can be just on the right side of pad 38 and just to the left of the bondwire connected to lead BH1.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
   a lead frame, said lead frame including a plurality of spaced conductive pads and a plurality of leads;
   a molded shell, said molded shell including a plurality of walls defining a space and a base portion, said base portion including said spaced conductive pads and a mold body disposed between said spaces; and
   a plurality of power semiconductor devices each having one power electrode electrically and mechanically attached to a respective first spaced conductive pad by a layer of conductive adhesive, and an opposing power electrode disposed on an opposing surface thereof electrically attached to a second spaced conductive pad by at least one wire bond;

said first spaced conductive pads are arranged along one line and said second spaced conductive pads are arranged along another opposing line in a same plane as that of the first spaced conductive pads; wherein a current detection resistor is directly electrically connected to a pair of leads which extend through at least one of said walls to the exterior of said molded shell, and a heatsink is attached to said base portion and in thermal contact with at least said first spaced conductive pads by a thermally conductive adhesive.

2. A power module according to claim 1, wherein said at least one wire bonds are generally parallel.

3. A power module according to claim 1, wherein said opposing power electrode of each power semiconductor device is electrically connected to a second spaced conductive pad by a plurality of wire bonds, said wire bonds being arranged in a staggered manner.

4. A power module according to claim 1, further comprising a plurality of signal leads each designated for sending control signals to a respective control electrode of a respective power semiconductor device, said signal leads being embedded in one of said walls of said molded shell and each including a wire bond pad which is electrically connected to a respective control electrode by a wire bond.

5. A power module according to claim 1, further comprising a thermistor.

6. A power module according to claim 1, wherein said defined space is filled with an encapsulant.

7. A power module according to claim 6, wherein said encapsulant is a silicone gel.

8. A power module according to claim 1, wherein said power semiconductor devices are power MOSFETs.

9. A power module according to claim 1, wherein said power semiconductor devices are arranged to form at least one half-bridge.

10. A power module according to claim 1, wherein said power semiconductor devices are arranged to form at least three half-bridges.

11. A power module according to claim 10, wherein said leads include a power input lead, a ground lead and a plurality of output lead, each output lead being designated for carrying power from a respective half-bridge.

12. A power module according to claim 1, wherein at least one of said leads is a power input lead, another lead is a ground lead, and a third lead is an output lead.

13. A power module according to claim 1, further comprising a lid attached to said walls to enclose said defined space.

14. A power module according to claim 1, wherein said power semiconductor devices are attached to said first spaced conductive pads by solder, and said molded shell is comprised of a molding material that is capable of withstanding the reflow temperature of said solder.

15. A power module according to claim 14, wherein said molding material is polypthalamide.

16. A power module according to claim 1, wherein said base portion includes a plurality of bumps on the exterior thereof to serve as a spacer for spacing a heatsink.

17. A power module according to claim 16, wherein said bumps have a height of 0.1 mm.

18. A power module according to claim 1, further comprising a plurality of bumps on an exterior surface of said base portion to space said heatsink from said base portion.

* * * * *